(12) United States Patent
Aoki

(10) Patent No.: US 6,888,191 B2
(45) Date of Patent: May 3, 2005

(54) SEMICONDUCTOR DEVICE AND FABRICATION PROCESS THEREFOR

(75) Inventor: Hitoshi Aoki, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/960,517

(22) Filed: Sep. 24, 2001

(65) Prior Publication Data

US 2002/0072173 A1 Jun. 13, 2002

(30) Foreign Application Priority Data

Nov. 27, 2000 (JP) .................................... 2000-359535

(51) Int. Cl.$^7$ .................... H01L 29/788; H01L 29/76
(52) U.S. Cl. .................. 257/315; 257/316; 257/335; 257/336; 257/337; 257/366; 257/408; 257/413; 438/286
(58) Field of Search ............... 257/314, 315, 257/316, 335, 336, 337, 366, 384, 408, 413; 438/286, 201, 257, 264, 267, 303, 305, 593, 594, 596

(56) References Cited

U.S. PATENT DOCUMENTS

| | | | |
|---|---|---|---|
| 4,949,136 A | | 8/1990 | Jain ........................... 257/344 |
| 5,091,763 A | | 2/1992 | Sanchez ..................... 257/344 |
| 5,130,769 A | * | 7/1992 | Kuo et al. .................. 257/316 |
| 5,189,497 A | * | 2/1993 | Komori et al. ............. 257/314 |
| 5,202,576 A | * | 4/1993 | Liu et al. .................... 257/315 |
| 5,585,293 A | * | 12/1996 | Sharma et al. ............. 438/261 |
| 5,880,500 A | | 3/1999 | Iwata et al. ................. 257/336 |
| 5,912,487 A | * | 6/1999 | Hong .......................... 257/315 |
| 6,069,382 A | * | 5/2000 | Rahim ........................ 257/316 |
| 6,133,096 A | * | 10/2000 | Su et al. ..................... 438/624 |
| 6,153,469 A | * | 11/2000 | Yun et al. ................... 438/257 |
| 6,236,085 B1 | * | 5/2001 | Kawaguchi et al. ........ 257/345 |
| 2001/0019163 A1 | * | 9/2001 | Fournel et al. ............. 257/391 |

FOREIGN PATENT DOCUMENTS

| | | |
|---|---|---|
| JP | 52-146569 | 12/1977 |
| JP | 55-130169 | 10/1980 |
| JP | 60-136376 | 7/1985 |
| JP | 62-229976 | 10/1987 |
| JP | 63-045860 | 2/1988 |
| JP | 1-120067 | 5/1989 |
| JP | 04-056283 | 2/1992 |
| JP | 07-135312 | 5/1995 |
| JP | 08-046190 | 2/1996 |
| JP | 08-148679 | 6/1996 |
| JP | 08-293566 | 11/1996 |
| JP | 09-172098 | 6/1997 |
| JP | 10-189954 | 7/1998 |
| JP | 10-209306 | 8/1998 |
| JP | 11-307656 | 11/1999 |
| JP | 2000-232172 | 8/2000 |

* cited by examiner

Primary Examiner—Amir Zarabian
Assistant Examiner—Toniae M. Thomas
(74) Attorney, Agent, or Firm—Nixon & Vanderhye P.C.

(57) ABSTRACT

A semiconductor device comprises: a semiconductor substrate of a first conductivity type; a first electrode provided on the semiconductor substrate with the intervention of a gate insulation film; a second electrode provided at least on the first electrode with the intervention of an intermediate insulation film; and a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath the first electrode.

23 Claims, 5 Drawing Sheets

SEMICONDUCTOR DEVICE AND FABRICATION PROCESS THEREFOR

CROSS-REFERENCE TO RELATED APPLICATION

This application is related to Japanese application No. 2000-359535 filed on 27. Nov. 2001, whose priority is claimed under 35 USC § 119, the disclosure of which is incorporated by reference in its entirety.

BACKGROUND OF THE INVENTION

1. Field of the Invention

The present invention relates to a semiconductor device having a high breakdown voltage transistor structure, and to a fabrication process therefor.

2. Description of the Related Art

High voltage operating transistors in semiconductor devices such as non-volatile semiconductor memories (e.g., flash memories) and liquid crystal drivers operative at a high voltage differ in structure from MOS transistors operative at an ordinary voltage. Such a transistor has substantially the same construction as an ordinary LDD-type MOS transistor but has a greater offset width than an ordinary sidewall spacer width in its LDD region (particularly, the greater offset width portion is called "offset region").

More specifically, Japanese Unexamined Patent Publication No. 10(1998)-189954 discloses a novel high breakdown voltage transistor and a fabrication process therefor, in which an LDD offset region is formed by utilizing a double-layer gate electrode structure. The high breakdown voltage transistor can prevent deterioration of its driving performance, and employ a salicide process which is one of resistance reduction techniques.

A fabrication process for the high breakdown voltage transistor will be described with reference to FIGS. 14 to 17.

As shown in FIG. 14, a semiconductor substrate 21 having a device isolation oxide film (not shown) formed by a known device isolation process is first channel-doped, and then a first polysilicon layer 23 is formed on the substrate with the intervention of a gate insulation film 22.

In turn, a first gate electrode 24 is formed by a photolithography process as shown in FIG. 15. Then, a resist pattern (not shown) having an opening in a high breakdown voltage transistor formation region is formed on the resulting substrate, and LDD offset regions 25 of the high breakdown voltage transistor are formed in the substrate by ion implantation with the use of the resist pattern.

Thereafter, a second polysilicon film 27 is formed over the resulting substrate with the intervention of an intermediate insulation film 26 as shown in FIG. 16.

As shown in FIG. 17, a second gate electrode 28 is formed as covering the first gate electrode 24 by a photolithography process. Then, a resist pattern (not shown) having an opening in the high breakdown voltage transistor formation region is formed on the resulting substrate by a photolithography process, and ion implantation is performed with an energy such as not to allow ions to penetrate through the first and second gate electrodes 24, 28 for formation of source/drain regions 30.

For further micro-miniaturization of the device, wider diffusion of an impurity due to a heat treatment should be prevented. To this end, the heat treatment is carried out at a lower temperature in the fabrication process. Therefore, it is difficult to improve a junction breakdown voltage by broadening a diffusion profile by way of the heat treatment. In some cases, even the aforesaid high breakdown voltage transistor fails to satisfactorily ensure a required breakdown voltage.

An attempt may be made to form the source/drain regions at a sufficiently great junction depth by more deeply implanting impurity ions into the substrate with a higher energy. However, the gate electrode which is to be employed as a self-alignment mask for the ion implantation has a reduced thickness for improvement of micro-processability and for suppression of gate electrode depletion. Therefore, this attempt is useless.

In view of the foregoing, there is a demand for a high breakdown voltage transistor having a structure suitable for a micro-fabrication process, and a fabrication process for such a high breakdown voltage transistor.

SUMMARY OF THE INVENTION

In accordance with a first aspect of the present invention, there is provided a semiconductor device comprising: a semiconductor substrate of a first conductivity type; a first electrode provided on the semiconductor substrate with the intervention of a gate insulation film; a second electrode provided at least on the first electrode with the intervention of an intermediate insulation film; and a pair of impurity regions of a second conductivity type provided in a spaced relation in the semiconductor substrate; at least one of the impurity regions comprising a low concentration impurity region, an intermediate concentration impurity region and a high concentration impurity region sequentially arranged in this order from a region located underneath the first electrode.

In accordance with a second aspect of the present invention, there is provided a process for fabricating a semiconductor device, comprising the steps of: (i) forming a gate insulation film on a semiconductor substrate of a first conductivity type and forming a first electrode on the gate insulation film; (ii) subjecting the resulting substrate to implantation of ions of a second conductivity type by using the first electrode as a mask; (iii) forming an intermediate insulation film on the resulting semiconductor substrate and forming a second electrode on the intermediate insulation film with at least a part of the second electrode being disposed on the first electrode; (iv) subjecting the resulting substrate to implantation of ions of the second conductivity type with an implantation energy that causes the ions to be implanted into a region of the semiconductor substrate formed with either of the first and second electrodes but forbids the ions to be implanted into a region of the semiconductor substrate formed with the first and second electrodes in a stacked relation; and (v) subjecting the resulting substrate to implantation of ions of the second conductivity type with an implantation energy that forbids the ions to penetrate through the first electrode and the second electrode; whereby the semiconductor device is fabricated as having at least one impurity region of the second conductivity type including a low concentration impurity region, an intermediate concentration impurity region and a high concentration impurity region sequentially arranged in this order from a region located underneath the first electrode.

DETAILED DESCRIPTION OF THE INVENTION

Figure 1:
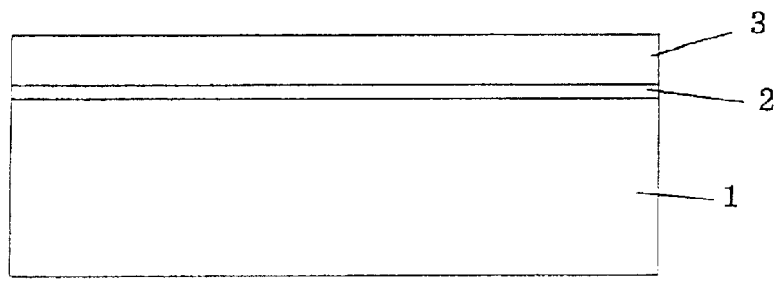
FIGS. 1 to 4 are schematic sectional views for explaining a fabrication process for a semiconductor device according to a first embodiment of the present invention.

A semiconductor device -according to the present invention essentially includes a semiconductor substrate of a first conductivity type, a gate insulation film, a first electrode, an intermediate insulation film, a second electrode and a pair of impurity regions of a second conductivity type provided in a spaced relation. The semiconductor device includes a so-called high breakdown voltage MOS transistor, which may be of a P type or an N type.

The semiconductor substrate to be employed for the inventive semiconductor device is not particularly limited, but may be any of those typically employed for semiconductor devices. Exemplary materials for the semiconductor substrate include elemental semiconductors such as silicon and germanium, and compound semiconductors such as GaAs, In GaAs and ZnSe. A silicon substrate is particularly preferred among others. The substrate may be an SOI substrate, a multi-layer SOI substrate or the like. The semiconductor substrate preferably has a device isolation region formed thereon (or on a semiconductor surface layer of the SOI substrate). Further, the semiconductor substrate may be of a single layer structure or a multi-layer structure formed with a transistor, a capacitor, a resistor, a circuit constituted by these elements, a semiconductor device, an interlayer insulation film, an interconnection layer and the like in combination. The device isolation region may be constituted by any of various device isolation films such as a LOCOS film, a trench oxide film and an STI film. In the present invention, the semiconductor substrate is of the first conductivity type which may be either the P type or the N type, and preferably has a proper sheet resistance.

In the present invention, the gate insulation film is capable of functioning as a gate insulation film or a tunnel insulation film in the semiconductor device. The intermediate insulation film is disposed at least between the first and second electrodes for insulating the first and second electrodes from each other. The gate insulation film and the intermediate insulation film may each be a single layer film or a multi-layer film constituted, for example, by a silicon oxide film (a thermally oxidized film, a low temperature oxidized film (LTO film) or a high temperature oxidized film (HTO film)), a silicon nitride film, an SOG film, a PSG film, a BSG film and/or a BPSG film. The thicknesses of the gate insulation film and the intermediate insulation film are each determined depending on the function of the film, and may be, for example, about 5 to about 50 nm and about 5 to about 50 nm, respectively. The intermediate insulation film may be provided on the generally entire surface of the semiconductor substrate including the first electrode, or may cover a part of the surface of the semiconductor substrate. The intermediate insulation film is preferably composed of a material which is capable of functioning as an etching stopper when the second electrode is processed as will be described later.

The first electrode is capable of functioning as a gate electrode of an ordinary MOS transistor, a capacitor electrode, a resistor element, or a floating gate electrode of a memory transistor. The second electrode is capable of functioning as a gate electrode of an ordinary MOS transistor, a capacitor electrode, a resistor element, or a control gate electrode of a memory transistor. The first electrode and the second electrode may each be a single layer film or a multi-layer film constituted, for example, by a semiconductor film such as of an amorphous, monocrystalline or polycrystalline N-type or P-type elemental semiconductor (e.g., silicon, germanium or the like) or a compound semiconductor (e.g., GaAs, InP, ZnSe or CsS or the like), a metal film such as of gold, platinum, silver, copper or aluminum, a high melting point metal film such as of titanium, tantalum or tungsten and/or a film of a silicide of a high melting point metal or a polycide. A silicon film or a silicon film having a surface entirely or partly composed of a silicide of a high melting point metal are particularly preferred. The first and second electrodes each have a thickness of about 100 to about 400 nm, for example, and the first electrode preferably has a greater thickness than the second electrode. The first and second electrodes each have a shape and a size which are properly determined depending on the function, application voltage, material and thickness thereof in consideration of the micro-miniaturization of the semiconductor device to be fabricated. For example, the first electrode typically has a rectangular shape. The shape and size of the second electrode may be such that the second electrode generally entirely covers the first. electrode and further extends to one side or opposite sides of the first electrode on the semiconductor substrate, or may be disposed only on the first electrode.

Sidewall insulation films may be provided on side walls of the first electrode and/or the second electrode. The thickness of the sidewall insulation films may properly be determined depending on the thicknesses of the first and second electrodes, voltages to be applied to the first and second electrodes and the like. The first electrode and/or the second electrode may have a conductive layer (e.g., a metal film, a high melting point metal film or a film of a silicide of a high melting point metal) partly or entirely covering the surface thereof. The thickness of the conductive layer is properly determined depending on the thicknesses and materials of the first and second electrodes, and preferably about 10 to about 200 nm.

The pair of impurity regions of the second conductivity type are provided in a spaced relation. That is, the impurity regions are spaced from each other on opposite sides of the first and second electrodes with a channel region interposed therebetween. The second conductivity type is the P type if the semiconductor substrate is of the N type, and is the N type if the semiconductor substrate is of the P type. At least one of the pair of impurity regions has a low concentration impurity region, an intermediate concentration impurity region and a high concentration impurity region sequentially arranged in this order from the channel region, i.e., from a region located underneath the first electrode. As long as the impurity region has the aforesaid arrangement, the impurity region further includes impurity diffusion layers of different impurity concentrations arranged vertically, horizontally or diagonally from the low concentration impurity region, the intermediate concentration impurity region and/or the high concentration impurity region.

The low concentration impurity region is generally capable of functioning as an offset region having a relatively low impurity concentration. For example, the low concentration impurity region has an impurity concentration on the order of $10^{18}$ ions/cm$^3$, and is preferably provided at least in a surface portion of the semiconductor substrate adjacent to the channel region. Where the second electrode is disposed only on the first electrode, the low concentration impurity region may extend from the surface portion of the semiconductor substrate adjacent to the channel region to the inside of the substrate as surrounding the intermediate concentration impurity region and the high concentration impurity region to be described later. The low concentration impurity region is disposed at a depth of about 100 to about 600 nm as measured from the surface of the semiconductor substrate.

The intermediate concentration impurity region is generally capable of functioning as an offset region having a higher impurity concentration than the low concentration impurity region. For example, the intermediate concentration impurity region has an impurity concentration on the order of $1 \times 10^{18}$ to $10^{19}$ ions/cm$^3$, and is preferably provided adjacent the low concentration impurity region. The intermediate concentration impurity region may be provided only in a surface portion of the semiconductor substrate, or extend from the surface portion of the semiconductor substrate to the inside of the substrate as surrounding the high concentration impurity region to be described later or as being partly or entirely surrounded by the low concentration impurity region. The intermediate concentration impurity region is disposed at a depth of about 100 to about 600 nm as measured from the surface of the semiconductor substrate.

The high concentration impurity region is generally capable of functioning as a source/drain region, and has a higher impurity concentration than the intermediate concentration impurity region. For example, the high concentration impurity region has an impurity concentration on the order of $1 \times 10^{20}$ to $10^{21}$ ions/cm$^3$, and is preferably disposed adjacent the intermediate concentration impurity region. The high concentration impurity region is preferably provided only in a surface portion of the semiconductor substrate, and a conductive layer as described above may be provided as partly or entirely covering the surface of the high concentration impurity region. The high concentration impurity region is disposed at a depth of about 100 to about 400 nm as measured from the surface of the semiconductor substrate. Where the conductive layer is provided on the surface of the high concentration impurity region, the thickness of the conductive layer is preferably about 10 to about 200 nm. The high concentration impurity region may be surrounded by the low concentration impurity region and the intermediate concentration impurity region, or surrounded only by the low concentration impurity region.

In the inventive fabrication process for the semiconductor device, forming a gate insulation film on a semiconductor substrate of a first conductivity type and forming a first electrode on the gate insulation film in the step (i). The gate insulation film can be formed by a thermal oxidation process, a CVD process, a sputtering process or an evaporation process, depending on a material for the gate insulation film. The formation of the first electrode can be achieved in the same manner as formation of a gate electrode for an ordinary MOS transistor.

In the step (ii), ions of a second conductivity type are implanted into the semiconductor substrate by using the first electrode as a mask. Examples of the ions of the second conductivity type include N-type ions such as phosphorus ions and arsenic ions, and P-type ions such as boron ions and $BF_2$ ions. The ion implantation is intended for formation of a low concentration impurity region. An implantation energy of 5 to 40 keV and a dose of about $5 \times 10^{12}$ to $10^{13}$ ions/cm$^2$, for example, are employed for the formation of the low concentration impurity region.

Where a second electrode is formed only on the first electrode in the step (iii), the ion implantation to be performed in the step (ii) may be intended for formation of an impurity region other than the low concentration impurity region (e.g., an intermediate concentration impurity region). In this case, the ion implantation is performed at a dose of about $1 \times 10^{13}$ to $10^{14}$ ions/cm$^2$.

In the step (iii), an intermediate insulation film is formed on the semiconductor substrate and a second electrode is formed on the semiconductor substrate with the intervention of an intermediate insulation film with at least a part thereof being disposed on the first electrode. The intermediate insulation film is formed in the same manner as the gate insulation film. The formation of the second electrode is achieved in substantially the same manner as the formation of the first electrode.

In the step (iv), ions of the second conductivity type are implanted again into the semiconductor substrate. The ion implantation should be performed under conditions such as to cause the ions to be implanted into a region of the semiconductor substrate formed with either of the first and second electrodes but not to allow the ions to be implanted into a region of the semiconductor substrate formed with the first and second electrodes in a stacked relation. An implantation energy of about 40 to about 200 keV, for example, is employed for the ion implantation, depending on the thicknesses and materials of the first and second electrodes and the thickness of the intermediate insulation film. The ion implantation is intended for formation of the intermediate concentration impurity region. A dose of about $1 \times 10^{13}$ to about $2 \times 10^{14}$ ions/cm$^2$, for example, is employed for the formation of the intermediate concentration impurity region. Where the second electrode is provided only on the first electrode, the ion implantation to be performed in the step (iv) may be intended for formation of an impurity region other than the intermediate concentration impurity region (e.g., the low concentration impurity region). In this case, an implantation energy of about 40 to about 200 keV and a dose of about $5 \times 10^{12}$ to about $1 \times 10^{14}$ ions/cm$^2$ are employed for the ion implantation.

In the step (v), ions of the second conductivity type are further implanted into the semiconductor substrate. The ion implantation should be performed under conditions such as to allow the ions to penetrate through neither of the first and second electrodes. An implantation energy of about 3 to about 80 keV, for example, is employed for the ion implantation, depending on the thicknesses and materials of the first and second electrodes and the thickness of the intermediate insulation film. The ion implantation is intended for formation of a high concentration impurity region. A dose of about 1 to $5 \times 10^{15}$ ions/cm$^2$, for example, is employed for the formation of the high concentration impurity region.

By performing the steps described above, the semiconductor device can be fabricated which has the pair of impurity regions of the second conductivity type provided in a spaced relation on the opposite sides of the first electrode, at least one of the impurity regions including the low concentration impurity region, the intermediate concentration impurity region and the high concentration impurity region sequentially arranged in this order from the region located underneath the first electrode.

In the present invention, the steps (i) to (v) are not necessarily required to be performed in this order. For example, the step (v) may precede the step (iv). The inventive fabrication process may further include, as required, a heat treatment step, a photolithography step, an additional ion implantation step and the like typically required for an ordinary semiconductor process.

The step of forming sidewall insulation films on side walls of the first electrode and/or the second electrode may be performed between the steps (iv) and (v), while the steps (i) to (v) are performed in this order. The formation of the sidewall insulation films is achieved by a method known in the art. After the formation of the sidewall insulation films, ions of the second conductivity type may be implanted into the substrate with an implantation energy such as not to allow the ions to penetrate through the sidewall insulation films in the step (v), whereby the offset width of the impurity regions can be controlled as desired.

Where the second electrode is formed only on the first electrode in the step (iii), the impurity region of the second conductivity type including the low concentration impurity region, the intermediate concentration impurity region and the high concentration impurity region can assuredly be formed by performing the ion implantation in the step (v) after the formation of the sidewall insulation films. Where the second electrode is formed as extending from the first electrode onto the semiconductor substrate in the step (iii), an impurity region having a different impurity concentration can be formed in addition to the low concentration impurity region, the intermediate concentration impurity region and the high concentration impurity region by performing the ion implantation in the step (v) after the formation of the sidewall insulation films.

Further, it is preferred to perform the sidewall insulation film formation step between the steps (iv) and (v) and perform a salicide process with the use of a high melting point metal film after the step (v), while performing the steps (i) to (v) in this order. This allows for formation of conductive layers only on the first electrode and/or the second electrode and on the high concentration impurity region while preventing formation of a conductive layer on a so-called offset region. If it is possible to prevent deterioration of the characteristics of the semiconductor device which may occur due to unwanted silicide formation on the side walls of the gate electrode, the salicide process following the step (v) is not necessarily required to be performed after the sidewall insulation film formation step performed between the steps (iv) and (v).

With reference to the attached drawings, the inventive semiconductor device and the fabrication process therefor will hereinafter be described in detail by way of embodiments.

Embodiment 1

An explanation will be given to a semiconductor device including high breakdown voltage MOS transistors according to Embodiment 1 of the present invention, and to a fabrication process therefor.

Figure 4:
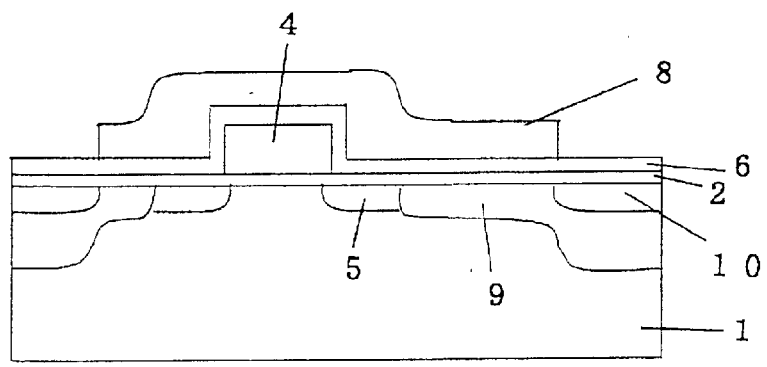
Figure 5:
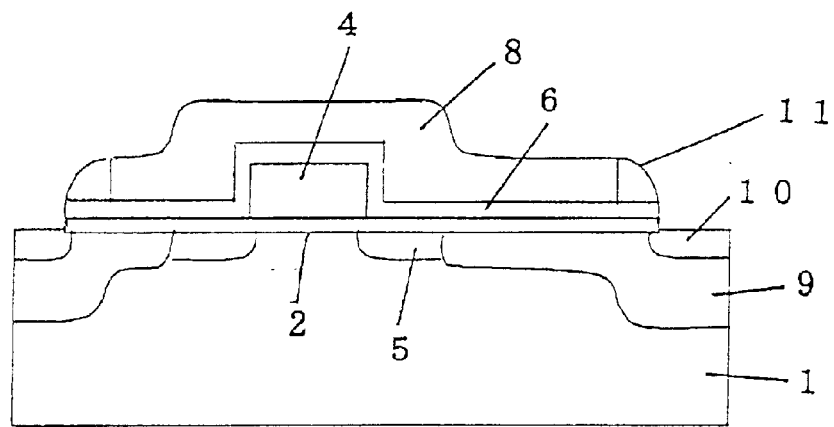
FIGS. 5 and 6 are schematic sectional views for explaining a fabrication process for a semiconductor device according to a second embodiment of the present invention.

As shown in FIG. 4, the semiconductor device includes a semiconductor substrate 1, a first gate electrode 4 provided on the semiconductor substrate 1 with the intervention of a gate insulation film 2, and a second gate electrode 8 provided over the first gate electrode 4 with the intervention of an intermediate insulation film 6. The second gate electrode 8 entirely covers the first gate electrode 4 and extends onto the semiconductor substrate 1. A pair of impurity regions are provided in the surface of the semiconductor substrate 1 in a spaced relation on opposite sides of the first gate electrode 4. The impurity regions each include a low concentration offset region 5, an intermediate concentration offset region 9 and a source/drain region 10 sequentially arranged in this order from a region located underneath the first gate electrode 4.

The semiconductor device is fabricated in the following manner.

A semiconductor substrate 1 having a device isolation oxide film (not shown) formed through a known device isolation region formation process is first channel-doped. Then, a first polysilicon film 3 is formed on the substrate with the intervention of a gate insulation film 2 for high breakdown voltage transistors as shown in FIG. 1.

Figure 2:
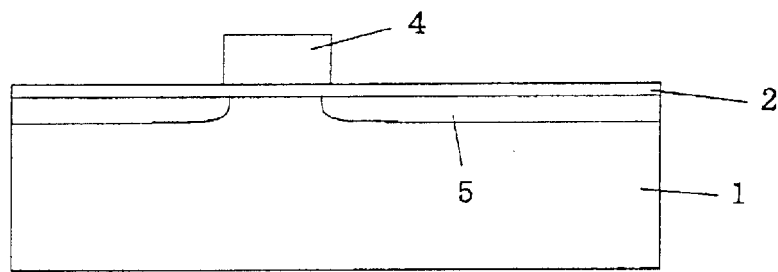

A first gate electrode 4 is formed through a photolithography process as shown in FIG. 2. The first gate electrode 4 has a thickness of 200 nm, for example.

In turn, a resist pattern (not shown) having an opening on a high breakdown voltage NMOS transistor formation region is formed on the resulting substrate through a photolithography process. Then, P ions are implanted into the substrate at a dose of $8 \times 10^{12}$ cm$^{-2}$ with an implantation energy of 50 keV by using the resist pattern as a mask for formation of low concentration offset regions 5 of a high breakdown voltage PMOS transistor.

Similarly, a resist pattern (not shown) having an opening on a high breakdown voltage PMOS transistor formation region is formed on the resulting substrate through a photolithography process. Then, B ions are implanted into the substrate at a dose of $8 \times 10^{12}$ cm$^{-2}$ with an implantation energy of 20 keV by using the resist pattern as a mask for formation of low concentration offset regions (not shown) of a high breakdown voltage NMOS transistor.

Figure 3:
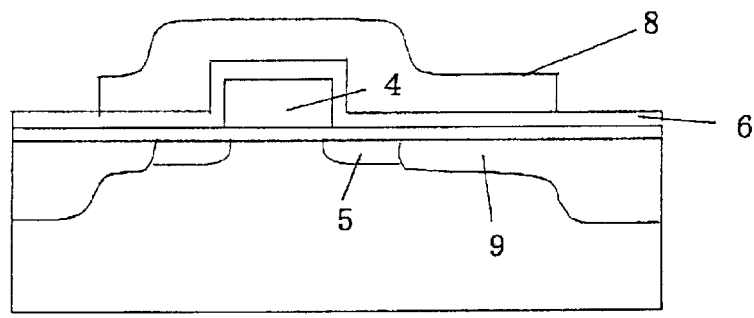

Subsequently, a second polysilicon film is formed over the resulting semiconductor substrate 1 with the intervention of an intermediate insulation film 6, and then a second gate electrode 8 is formed through a photolithography process as shown in FIG. 3. The second gate electrode has a thickness of 150 nm, for example. The second gate electrode is formed as covering the first gate electrode 4 and extending onto the semiconductor substrate 1 on opposite sides of the first gate electrode 4. In turn, a resist pattern (not shown) having an opening on the high breakdown voltage NMOS transistor formation region is formed on the resulting substrate through a photolithography process. Then, P ions are implanted into the substrate at a dose of $2 \times 10^{13}$ cm$^{-2}$ with an implantation energy (e.g., 150 keV) such as to cause the P ions to penetrate through a single electrode portion but not to allow the P ions to penetrate through a stacked electrode portion by using the resist pattern as a mask for formation of second intermediate offset regions 9.

Then, As ions are implanted into the substrate at a dose of $3 \times 10^{15}$ cm$^{-2}$ with an implantation energy (e.g., 50 keV) such as to allow the As ions to penetrate through neither of the first and second gate electrodes for formation of source/drain regions 10 as shown in FIG. 4.

Similarly, in the high breakdown voltage PMOS transistor formation region, B ions are implanted into the substrate, for example, at a dose of $2 \times 10^{13}$ cm$^{-2}$ with an implantation energy of 60 keV, and BF2 ions are implanted into the substrate, for example, at a dose of $3 \times 10^{15}$ cm$^{-2}$ with an implantation energy of 30 keV for formation of source/drain regions (not shown).

Further, the resulting substrate is subjected to an activation annealing process, an interlayer insulation film formation process, a contact hole formation process, a metallization process, a multi-level interconnection formation process, a protective film formation process and the like for completion of the first half of the semiconductor device fabrication process (wafer process), and further subjected to the second half of the semiconductor device fabrication process (assembly process).

Thus, the semiconductor device is fabricated.

Embodiment 2

A semiconductor device according to Embodiment 2 has substantially the same construction as the semiconductor device of Embodiment 1, except that sidewall insulation films 11 are formed on side walls of the second gate electrode 8, and the source/drain regions 10 and the second gate electrode 8 each have a silicide layer 12 on the surface thereof.

An explanation will next be given to a fabrication process for the semiconductor device, which is substantially the same as the fabrication process in Embodiment 1, but additionally employs a so-called salicide process.

A high breakdown voltage NMOS transistor and a high breakdown voltage PMOS transistor are fabricated by performing the same steps as in Embodiment i till the source/drain formation step (FIG. 4).

Thereafter, a silicon nitride film is formed over the resulting semiconductor substrate 1 and then etched back, whereby sidewall insulation films 11 are formed on side walls of the second gate electrode 8. At this time, silicon is exposed from the surfaces of the second gate electrode 8 and the source/drain regions 10.

Figure 6:
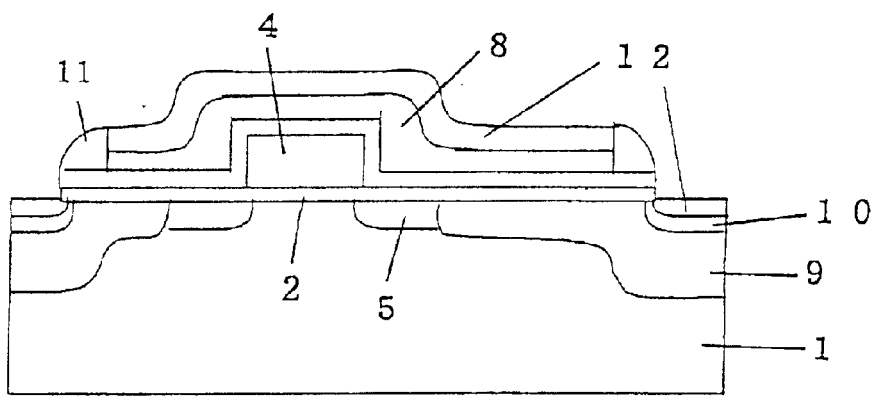

Subsequently, a Ti film is formed over the resulting semiconductor substrate 1, which is in turn subjected to a heat treatment for reaction of the Ti film with silicon and polysilicon (gate electrode). Then, an unreacted portion of the Ti film on the insulation film is removed with the use of an acid or the like. Thus, silicide films 12 are formed on the exposed silicon surface portions in a self-aligned manner as shown in FIG. 6.

Embodiment 3

Figure 7:
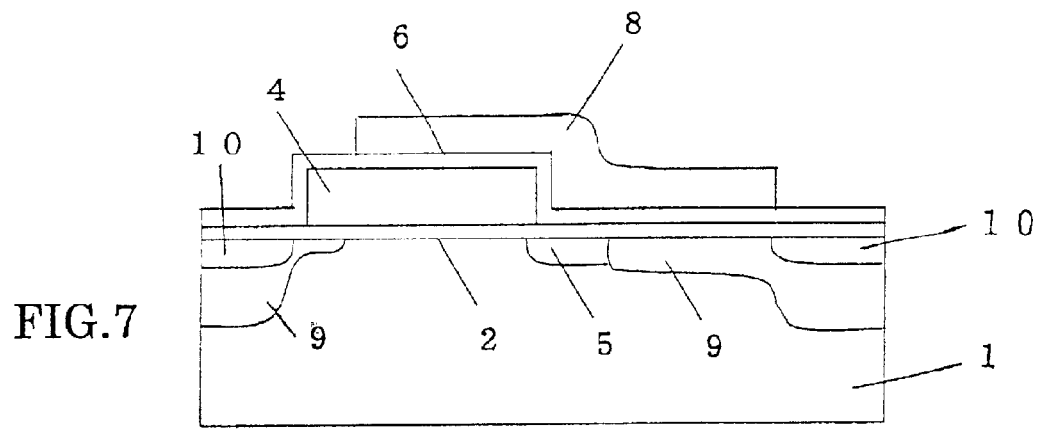
FIG. 7 is a schematic sectional view for explaining a fabrication process for a semiconductor device according to a third embodiment of the present invention.
Figure 8:
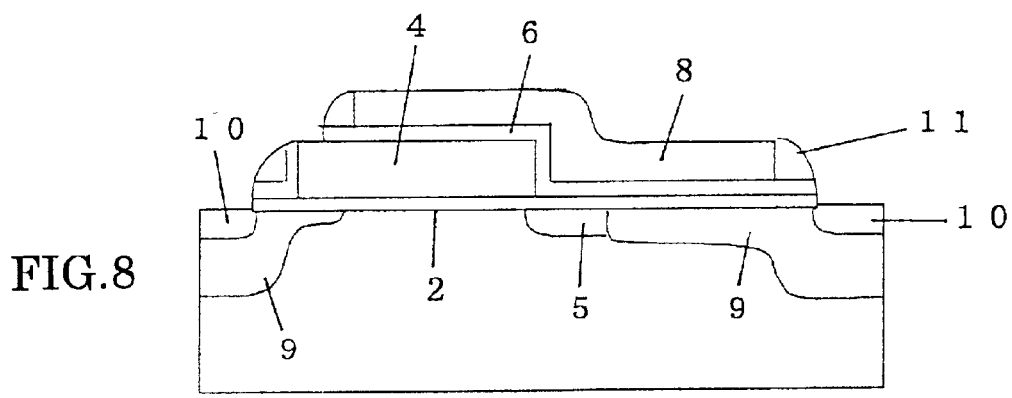
FIGS. 8 and 9 are schematic sectional views for explaining a fabrication process for a semiconductor device according to a fourth embodiment of the present invention.

As shown in FIG. 7, a semiconductor device according to Embodiment 3 has substantially the same construction as the semiconductor device of Embodiment 1, except that the second gate electrode 8 extends onto the semiconductor substrate 1 only on one side of the first gate electrode 4, and an impurity region provided on a side not formed with the second gate electrode 8 does not have the sequential arrangement of the low concentration offset region 5, the intermediate concentration offset region 9 and the source/drain region 10 but the low concentration offset region 5 is included in the intermediate concentration offset region 9.

The semiconductor device is fabricated in the following manner.

As in Embodiment 1, a second polysilicon film is formed over a semiconductor substrate 1 formed with a first gate electrode 4 and a first LDD offset region 5 with the intervention of an intermediate insulation film 6.

Subsequently, a second gate electrode 8 is formed through a photolithography process as shown in FIG. 7. The second gate electrode 8 covers a part of the first gate electrode 4, and further extends onto the semiconductor substrate 1 on one side of the first gate electrode 4.

Thereafter, the semiconductor device is completed in the same manner as in Embodiment 1.

Embodiment 4

Figure 9:
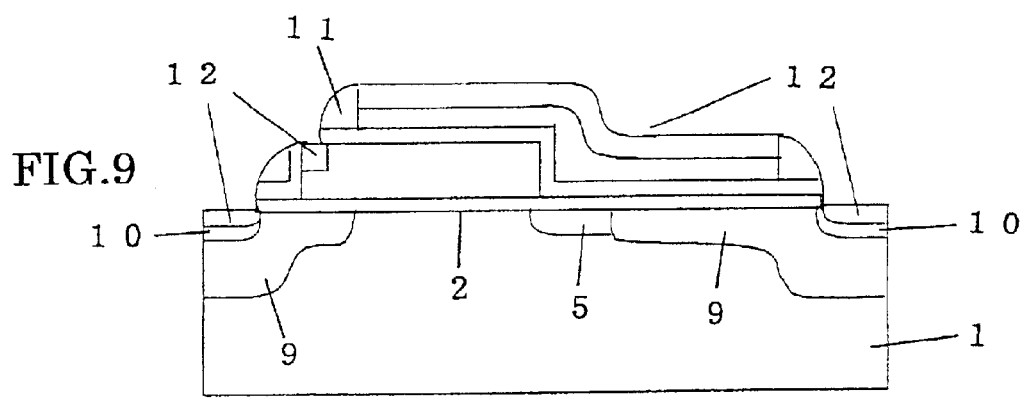

As shown in FIG. 9, a semiconductor device according to Embodiment 4 has substantially the same construction as the semiconductor device of Embodiment 3, except that sidewall insulation films 11 are provided on side walls of the second gate electrode 8, and silicide layers 12 are provided on the surfaces of the source/drain regions 10, on an exposed surface portion of the first gate electrode and on the surface of the second gate electrode 8.

An explanation will next be given to a fabrication process for the semiconductor device, which is substantially the same as the fabrication process in Embodiment 3, but additionally employs a so-called salicide process.

As in Embodiment 3, source/drain regions 10 are formed (FIG. 7), whereby a high breakdown voltage NMOS transistor and a high breakdown voltage PMOS transistor are fabricated.

Thereafter, a silicon nitride film is formed over the resulting semiconductor substrate 1 and then etched back, whereby sidewall insulation films 11 are formed on side walls of the second gate electrode 8 and on side walls of the first gate electrode 4 not covered with the second gate electrode 8.

Subsequently, the salicide process is performed in the same manner as in Embodiment 2, whereby silicide layers 12 are formed only on exposed silicon surface portions in a self-aligned manner as shown in FIG. 9.

The second gate electrode 8 is thus offset from the first gate electrode 4 to one side thereof in an overlapping relation, so that the total thickness of the first gate electrode 4 and the second gate electrode 8 is varied to make variations in effective impurity implantation amount in the offset region. Therefore, the semiconductor device can be fabricated with the source region and the drain region having different breakdown voltages. This improves the design flexibility.

Embodiment 5

Figure 12:
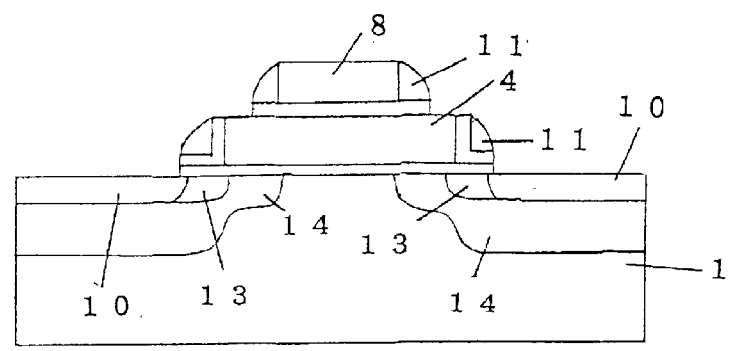

As shown in FIG. 12, a semiconductor device according to Embodiment 5 has substantially the same construction as the semiconductor device of Embodiment 1, except that the second gate electrode 8 is provided only on the first gate electrode 4, sidewall insulation films 11 are formed on side walls of the first gate electrode 4 and the second gate electrode 8, and the impurity regions each include a low concentration offset region 14, an intermediate concentration offset region 13 and a source/drain region 10 sequentially arranged in a configuration different from that shown in FIG. 4.

The semiconductor device is fabricated in the following manner.

Figure 10:
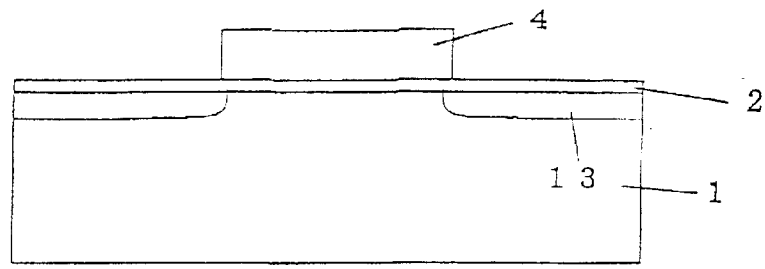
FIGS. 10 to 12 are schematic sectional views for explaining a fabrication process for a semiconductor device according to a fifth embodiment of the present invention.

As in Embodiment 1, a second polysilicon film is formed over a semiconductor substrate 1 formed with a first gate electrode 4 and an intermediate concentration offset region 13 with the intervention of an intermediate insulation film 6 as shown in FIG. 10.

Figure 11:
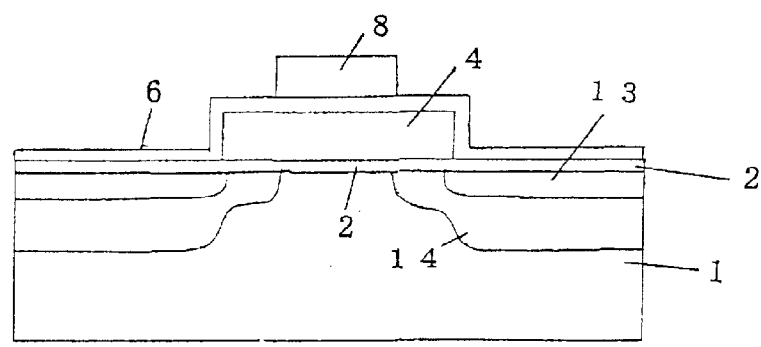

Subsequently, a second gate electrode 8 is formed only on the first gate electrode 4, as shown in FIG. 11, through a photolithography process. Then, low concentration offset regions 14 are formed in the substrate in the same manner as in Embodiment 1.

As in Embodiment 2, sidewall insulation films 11 are formed on side walls of the first gate electrode 4 and the second gate electrode 8, and the resulting substrate is subjected to ion implantation by using the first gate electrode 4, the second gate electrode 8 and the sidewall insulation films 11 as a mask for formation of source/drain regions 10 as shown in FIG. 12.

Then, the semiconductor device is completed in the same manner as in Embodiment 1.

Embodiment 6

Figure 13:
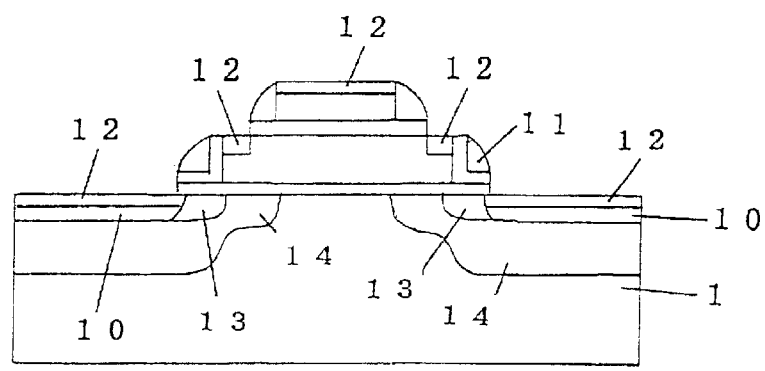
FIG. 13 is a schematic sectional view for explaining a fabrication process for a semiconductor device according to a sixth embodiment of the present invention.
Figure 14:
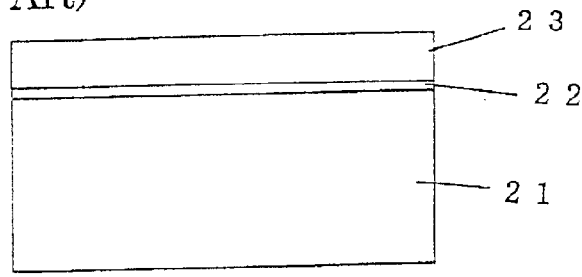
FIGS. 14 to 17 are schematic sectional views for explaining a fabrication process for a semiconductor device according to the prior art.
Figure 15:
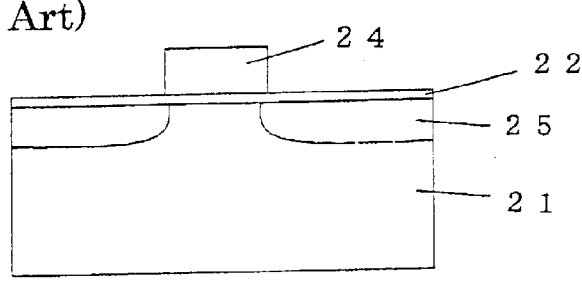
Figure 16:
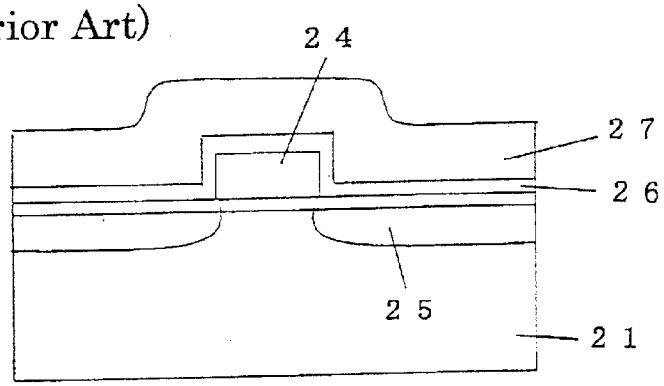
Figure 17:
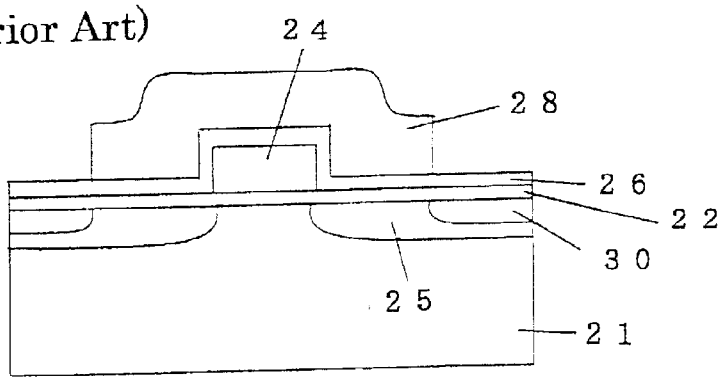

A semiconductor device according to Embodiment 6 has substantially the same construction as the semiconductor device of Embodiment 5, except that silicide layers 12 are provided on the surfaces of the source/drain regions 10, on exposed surface portions of the first gate electrode and on the surface of the second gate electrode 8 as shown in FIG. 13.

The semiconductor device is fabricated by employing the fabrication process according to Embodiment 5 and additionally the salicide process according to Embodiment 2.

In accordance with the present invention, at least one of the impurity regions includes the low concentration impurity region, the intermediate concentration impurity region and the high concentration impurity region sequentially arranged in this order from the region located underneath the first electrode, so that the so-called offset region is allowed to have a reduced impurity concentration. Thus, the semiconductor device has a higher breakdown voltage, ensuring an improved performance and a higher reliability. By properly determining the amount of the overlap between the first electrode and the second. electrode, the type of the high breakdown voltage junction can be determined with a variable characteristic and level of the breakdown voltage. Thus, the semiconductor device can be provided in conformity with design requirements.

Where the conductive layers are provided on the first electrode and/or the second electrode and on the high concentration impurity region, the semiconductor device is operable at a higher operating rate because the resistance of the interconnection is reduced.

Where the pair of impurity regions of the second conductivity type each include the low concentration impurity region, the intermediate concentration impurity region and the high concentration impurity region sequentially arranged in this order from the region located underneath the first electrode, the breakdown voltages of the source region and the drain region can be set at different levels by allowing the second electrode to cover the semiconductor substrate by different overlap amounts on the opposite sides of the first electrode. Thus, the semiconductor device can be provided in conformity with design requirements with an improved design flexibility.

Where the first electrode and the second electrode are used as a floating gate electrode and a control gate electrode, respectively, of a memory transistor, the high breakdown voltage semiconductor device can be fabricated through an ordinary memory transistor fabrication process.

In the semiconductor device fabrication process according to the present invention, the ion implantation is performed a plurality of times, so that the impurity region has a gentle impurity concentration profile. Further, the impurity region is subjected to triplet diffusion, so that the impurity concentration profile can be broadened by employing a low temperature heat treatment alone. Even a lower temperature micro-fabrication process allows the so-called offset region to have a more gentle impurity concentration profile. Since the implantation of the ions of the second conductivity type is performed with an implantation energy such as to cause the ions to be implanted into the region of the semiconductor substrate formed with either of the first electrode and the second electrode but not to allow the ions to be implanted into the region of the semiconductor substrate formed with the first electrode and the second electrode in a stacked relation, the impurity region is allowed to have a greater junction depth. This further improves the performance of the high breakdown voltage transistor.

Where the step of forming the sidewall insulation films on the side walls of the first electrode and/or the second electrode is performed between the steps (iv) and (v) and the implantation of the ions of the second conductivity type is performed with an implantation energy such as not to allow the ions to penetrate through the sidewall insulation films in the step (v), triplet diffusion of the impurity region can assuredly be achieved, or the impurity region is allowed to have a further more gentle impurity concentration profile.

Where the step of forming the sidewall insulation films on the side walls of the first electrode and/or the second electrode is performed between the steps (iv) and (v) and the salicide process with the use of the high melting point metal film is performed after the step (v), the conductive layers can be formed only on the desired regions, i.e., on the first electrode and/or the second electrode and on the high concentration impurity diffusion region, without the need for formation of an additional mask for the salicide process. This allows for reduction in the resistance of the interconnection, while providing the offset high resistance region. Thus, the semiconductor device which is operable at a higher operating rate can be fabricated through a simplified fabrication process.

Where the second electrode is formed as having a smaller thickness than the first electrode, the impurity implantation into the semiconductor substrate can easily be controlled to be permitted or prevented as desired.

What is claimed is:

1. A semiconductor device comprising:
    a semiconductor substrate of a first conductivity type;
    a first electrode provided on the semiconductor substrate with the intervention of a gate insulation film;
    a second electrode provided at least on the first electrode with the intervention of an intermediate insulation film;
    at least a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath at least one of the first and second electrodes;
    wherein the second electrode extends laterally beyond an edge of the first electrode so that the second electrode is provided over both the first electrode and at least part of at least one of the impurity regions with intervention of the intermediate insulating film;
    wherein the high concentration impurity region is laterally offset from and laterally spaced from the low concentration impurity region in said at least one impurity region; and
    wherein the high concentration impurity region is provided as being surrounded by the low concentration impurity region and the intermediate concentration impurity region, or surrounded only by the low concentration impurity region.

2. A semiconductor device as set forth in claim 1, further comprising conductive layers respectively provided on at least one of the first electrode and the second electrode, and on the high concentration impurity region.

3. A semiconductor device as set forth in claim 2, wherein the conductive layers comprise silicide.

4. A semiconductor device as set forth in claim 1, further comprising sidewall insulation films provided on at least one of the side walls of the first electrode and the second electrode.

5. A semiconductor device as set forth in claim 1, wherein the pair of impurity regions of the second conductivity type each include the low concentration impurity region, the intermediate concentration impurity region and the high concentration impurity region sequentially arranged in this order from the region located underneath the first electrode.

6. A semiconductor device as set forth in claim 1, wherein the intermediate concentration impurity region is provided only in a surface portion of the semiconductor substrate, or extend from the surface portion of the semiconductor substrate to the inside of the substrate as surrounding the high concentration impurity region, or as being partly or entirely surrounded by the low concentration impurity region.

7. A semiconductor device as set forth in claim 1, wherein the low concentration impurity region has an impurity concentration on the order of $10^{18}$ ions/cm$^3$, the intermediate concentration impurity region has an impurity concentration on the order of $1 \times 10^{18}$ to $10^{19}$ ions/cm$^3$, and the high concentration impurity region has an impurity concentration on the order of $1 \times 10^{20}$ to $10^{21}$ ions/cm$^3$.

8. A semiconductor device as set forth in claim 1, wherein the low concentration impurity region is disposed at a depth of 100 to 600 nm, the intermediate concentration impurity is disposed at a depth of about 100 to about 600 nm, and the high concentration impurity region is disposed at a depth of about 100 to about 400 nm as measured from the surface of the semiconductor substrate.

9. A semiconductor device comprising:
a semiconductor substrate of a first conductivity type;
a first electrode provided on the semiconductor substrate with the intervention of a gate insulation film;
a second electrode provided at least on the first electrode with the intervention of an intermediate insulation film;
at least a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath at least one of the first and second electrodes;
wherein the second electrode extends laterally beyond an edge of the first electrode so that the second electrode is provided over both the first electrode and at least part of at least one of the impurity regions with intervention of the intermediate insulating film;
wherein the high concentration impurity region is laterally offset from and laterally spaced from the low concentration impurity region in said at least one impurity region; and
wherein the first electrode has a greater thickness than the second electrode.

10. A semiconductor device as set forth in claim 1, wherein the second electrode entirely covers the first electrode and further extends to one side or opposite sides of the first electrode on the semiconductor substrate.

11. A semiconductor device as set forth in claim 1, wherein the first electrode and the second electrode serve as a floating gate electrode and a control gate electrode, respectively, of a memory transistor.

12. The semiconductor device of claim 1, wherein the second electrode is a gate electrode and extends laterally beyond an edge of the first electrode.

13. A semiconductor device comprising:
a semiconductor substrate of a first conductivity type;
a first electrode provided on the semiconductor substrate with the intervention of a gate insulation film;
a second electrode provided at least on the first electrode with the intervention of an intermediate insulation film;
a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath at least one of the first and second electrodes along a horizontal direction of the semiconductor substrate;
wherein the second electrode extends laterally beyond an edge of the first electrode so that the second electrode is provided over both the first electrode and at least part of at least one of the impurity regions with intervention of at least the intermediate insulating film; and
wherein the high concentration impurity region is provided as being surrounded by the low concentration impurity region and the intermediate concentration impurity region, or surrounded only by the low concentration impurity region.

14. The semiconductor device of claim 1, wherein the second electrode extends laterally beyond an edge of the first electrode so that the second electrode overlaps each of the first electrode and at least part of said low concentration impurity region and said intermediate concentration impurity region of at least one of said impurity regions of the second conductivity type.

15. A semiconductor device comprising:
a semiconductor substrate of a first conductivity type;
a first electrode provided on the semiconductor substrate with the intervention of a gate insulation film;
a second electrode provided at least on the first electrode with the intervention of an intermediate insulation film;
a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath at least one of the first and second electrodes;
wherein an overlapping width of the first electrode and a first one of said pair of impurity regions of the second conductivity type is different than an overlapping width of the first electrode and a second one of said pair of impurity regions of the second conductivity type;
wherein the high concentration impurity region is laterally offset from and laterally spaced from the low concentration impurity region in said at least one impurity region; and
wherein the high concentration impurity region is provided as being surrounded by the low concentration impurity region and the intermediate concentration impurity region, or surrounded only by the low concentration impurity region.

16. The semiconductor device of claim 1, wherein a distance from (a) an edge of the high concentration impurity region closest to the first electrode to (b) an edge of the intermediate concentration impurity region closest to the first electrode in a first one of said pair of impurity regions of the second conductivity type is different from the corresponding distance from (a) to (b) in a second of said pair of impurity regions of the second conductivity type.

17. The semiconductor device of claim 13, wherein a distance from (a) an edge of the high concentration impurity region closest to the first electrode to (b) an edge of the intermediate concentration impurity region closest to the first electrode in a first one of said pair of impurity regions of the second conductivity type is different from the corresponding distance from (a) to (b) in a second of said pair of impurity regions of the second conductivity type.

18. A semiconductor device comprising:

a semiconductor substrate of a first conductivity type;

a first electrode provided on the semiconductor substrate with the intervention of a gate insulation film;

a second electrode provided at least on the first electrode with the intervention of an intermediate insulation film;

at least a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order;

wherein the second electrode extends laterally beyond an edge of the first electrode so that the second electrode is provided over both the first electrode and at least part of at least one of the impurity regions with intervention of the intermediate insulating film;

wherein the high concentration impurity region is spaced apart from the low concentration impurity region in said at least one impurity region; and wherein the high concentration impurity region is provided as being surrounded by the low concentration impurity region and the intermediate concentration impurity region.

19. The semiconductor device of claim 18, wherein a distance from (a) an edge of the high concentration impurity region closest to the first electrode to (b) an edge of the intermediate concentration impurity region closest to the first electrode in a first one of said pair of impurity regions of the second conductivity type is different from the corresponding distance from (a) to (b) in a second of said pair of impurity regions of the second conductivity type.

20. A semiconductor device comprising:

a semiconductor substrate of a first conductivity type;

a first electrode provided on the semiconductor substrate with the intervention of a gate insulation film;

a second electrode provided at least on the first electrode with the intervention of an intermediate insulation film;

a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath at least one of the first and second electrodes along a horizontal direction of the semiconductor substrate;

wherein the second electrode extends laterally beyond an edge of the first electrode so that the second electrode is provided over both the first electrode and at least part of at least one of the impurity regions with intervention of at least the intermediate insulating film; and wherein the first electrode has a greater thickness than the second electrode.

21. A semiconductor device comprising:

a semiconductor substrate of a first conductivity type;

a first electrode provided on the semiconductor substrate with the intervention of a gate insulation film;

a second electrode provided at least on the first electrode with the intervention of an intermediate insulation film;

a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order from a region located underneath at least one of the first and second electrodes;

wherein an overlapping width of the first electrode and a first one of said pair of impurity regions of the second conductivity type is different than an overlapping width of the first electrode and a second one of said pair of impurity regions of the second conductivity type;

wherein the high concentration impurity region is laterally offset from and laterally spaced from the low concentration impurity region in said at least one impurity region; and wherein the first electrode has a greater thickness than the second electrode.

22. A semiconductor device comprising:

a semiconductor substrate of a first conductivity type;

a first electrode provided on the semiconductor substrate with the intervention of a gate insulation film;

a second electrode provided at least on the first electrode with the intervention of an intermediate insulation film;

at least a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in this order;

wherein the second electrode extends laterally beyond an edge of the first electrode so that the second electrode is provided over both the first electrode and at least part of at least one of the impurity regions with intervention of the intermediate insulating film;

wherein the high concentration impurity region is spaced apart from the low concentration impurity region in said at least one impurity region; and wherein the first electrode has a greater thickness than the second electrode.

23. A semiconductor device comprising:

a semiconductor substrate of a first conductivity type;

a first electrode provided on the semiconductor substrate with the intervention of a gate insulation film;

a second electrode provided at least on the first electrode with the intervention of an intermediate insulation film;

at least a pair of impurity regions of a second conductivity type provided in a spaced relation in the semiconductor substrate, at least one of the impurity regions comprising a low concentration impurity region, an intermediate concentration impurity region and a high concentration impurity region sequentially arranged in said one impurity region in this order from a region located underneath at least one of the first and second electrodes;

wherein the entirety of the high concentration impurity region is laterally offset from and laterally spaced from the low concentration impurity region in said one impurity region so that the high and low concentration impurity regions are each provided in the same impurity region; and wherein the first electrode has a greater thickness than the second electrode.

* * * * *